United States Patent [19]

Purmal

[11] 3,964,430
[45] June 22, 1976

[54] SEMI-CONDUCTOR MANUFACTURING REACTOR INSTRUMENT WITH IMPROVED REACTOR TUBE COOLING

[75] Inventor: Gerald W. Purmal, San Carlos, Calif.

[73] Assignee: Unicorp Incorporated, Sunnyvale, Calif.

[22] Filed: Nov. 14, 1974

[21] Appl. No.: 523,807

[52] U.S. Cl. .................................. 118/49; 118/69; 219/10.79
[51] Int. Cl.² ...................................... C23C 13/08
[58] Field of Search ....................... 118/48–49.5, 118/69; 219/10.49, 10.57, 10.79; 148/174, 175

[56] References Cited
UNITED STATES PATENTS

| | | | |
|---|---|---|---|
| 2,339,157 | 1/1944 | Denneen et al. | 219/10.79 X |
| 2,512,893 | 6/1950 | Gehr | 219/10.79 X |
| 2,528,714 | 11/1950 | Wadhams | 219/10.79 X |
| 2,556,243 | 6/1951 | Vaughn | 219/10.79 X |
| 2,848,566 | 8/1958 | Limpel | 219/10.57 X |
| 3,092,511 | 6/1963 | Edelman | 118/48 |
| 3,404,462 | 10/1968 | Hanson et al. | 34/1 |
| 3,472,200 | 10/1969 | Gerling | 118/643 X |
| 3,862,397 | 1/1975 | Anderson et al. | 118/49.5 X |

Primary Examiner—Morris Kaplan
Attorney, Agent, or Firm—Limbach, Limbach & Sutton

[57] ABSTRACT

A quartz reactor tube is provided with an electrically conductive hollow tube shaped into a coil surrounding but not contacting the outside surface of the quartz tube. The coil serves a double purpose of indirectly heating semi-conductor wafers within the quartz tube when the coil is energized with radio frequency energy, and serves to cool the outside surface of the quartz tube by directing air thereagainst through a large number of holes provided in the tubing. The air streams breakup a stagnant air insulating layer on the outside surface of the reactor tube in order to permit heat to be transferred from the tube to its surroundings. The cooler tube results in less gaseous material being deposited on its inside surfaces and thus increases the interval between reactor tube cleanings.

6 Claims, 1 Drawing Figure

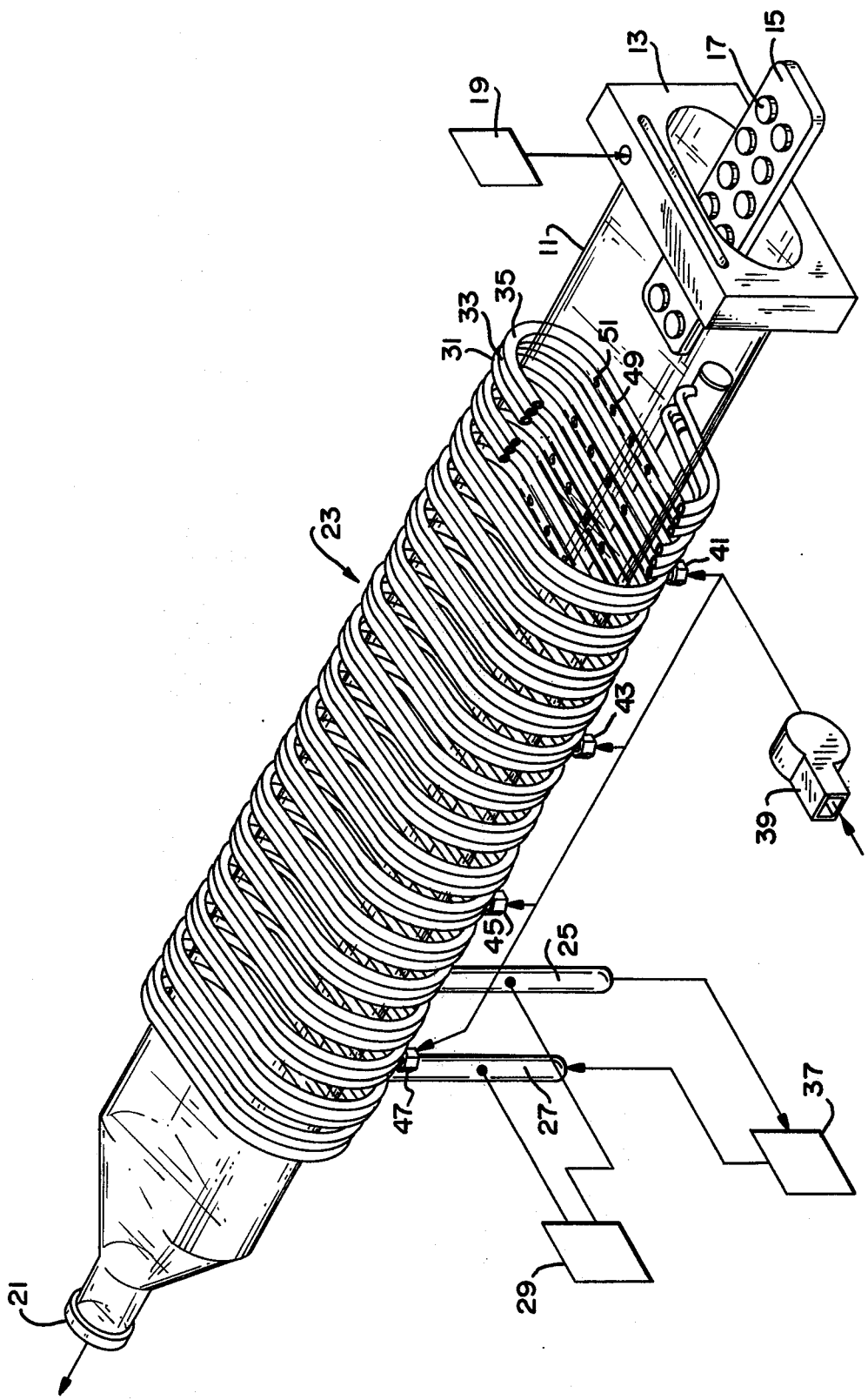

SEMI-CONDUCTOR MANUFACTURING REACTOR INSTRUMENT WITH IMPROVED REACTOR TUBE COOLING

BACKGROUND OF THE INVENTION

The present invention is directed toward an improvement in a chemical vapor deposition reactor, such as the UNIPAK and MINIPAK reactor systems manufactured and sold by Unicorp, Incorporated of Sunnyvale, California, the assignee of the present application. Such a reactor provides a quartz tube within a radio frequency coil. Silicon wafers to be processed are carried by a graphite susceptor within the reactor tube. When the coil is energized with a source of radio frequency energy, eddy currents are generated in the susceptor, thus causing it and the silicon wafers thereon to become heated. The gaseous atmosphere within the reactor tube is controlled to contain desired materials which chemically react with the heated silicon surface to form layers of material thereon.

The inside surface of the quartz reactor tube also becomes coated with gaseous material depositing thereon. This coating results from the reactor tube walls themselves becoming heated during the processing of wafers to a temperature sufficient to cause deposition thereon. As the deposition layer on the tube increases in thickness, it eventually begins to peel and chip off and is a large source of impurities in the resulting semi-conductor product. To avoid such impurities, the reactor tube must frequently be removed for thorough cleaning of its inside surface. Only 2 or 3 batches of semi-conductor wafers can be processed with common techniques between cleanings. This frequent cleaning is required even though a fan of ordinary design is provided on the outside of the reactor tube for cooling.

Therefore, it is a primary object of the present invention to provide an improved chemical vapor deposition reactor product and process that results in a reduced cleaning requirement of the inside of the reactor tube.

SUMMARY OF THE INVENTION

It has been found that a stagnant layer of air exists on the outside surface of the reactor tube that prevents heat transferring from the tube to its surrounds, and thus insulating the tube against cooling. According to one aspect of the present invention, this stagnant layer is purposely disturbed by a blast of air or other inert gas directed against the outside surface of the reactor tube. This blast is preferably provided by a plurality of nozzels positioned to cover a two dimensional surface and each direct air against the outside surface of the reactor tube at a velocity of more than 5,000 feet per minute. Such a bombardment, it has been found, breaks up the stagnant air layer on the outside surface of the reactor tube which substantially destroys the insulation that the layer normally provides. The walls of the reactor tube are thus allowed to cool by transfer of heat into its surroundings at a much higher rate than before this insulating layer was broken up.

According to another aspect of the present invention, cooling gas is directed against the outside surface of the reactor tube from a hollow elongated tubular material wrapped in the shape of a coil around the outside of the reactor tube without touching it. A number of holes provided through the wall of the tubular coil material on its side facing the reactor tube provides for the plurality of high pressure air jets necessary to break up the undesirable stagnant boundary layer on the outside of the tube. For an induction reactor, a single coil may be utilized for air distribution and serve as a radio frequency induction coil, thus serving two purposes.

The various aspects of the present invention have only been briefly described. A specific example of the present invention is given in the following description which should be taken in conjunction with the accompanying drawings.

BRIEF DESCRIPTION OF THE DRAWING

The drawing shows the central elements of a reactor tube assembly incorporating the improvement of the present invention, with supporting interconnecting equipment being indicated in schematic form.

DESCRIPTION OF A PREFERRED EMBODIMENT

A reactor tube 11 is preferably made of quartz. Its walls are of substantially uniform thickness. In cross-section, the reactor tube 11 has flat bottom and top surfaces joined by curved side walls. An end plate 13 attached to a large end opening of the reactor tube 11 provides an opening for access into the reactor tube 11 for wafer carrying susceptors. Such a susceptor 15 having a plurality of round silicon wafer substrates, such as the wafer 17, is shown in the drawing to be part way through the opening into the reactor tube 11. When the wafers on the susceptor 15 are to be processed, the susceptor 15 is positioned completely within the reactor tube 11. The front opening is then closed by a door (not shown). A source 19 of gaseous material is connected to this end of the reactor tube 11 for introducing gases into the reactor tube of a type desired to chemically react with and deposit on the surfaces of the silicon wafers. Such gaseous materials flow from the source 19 through the reactor tube 11 to exit at a small end 21 of the reactor tube 11.

In order to obtain the desired chemical reaction on the surface of the wafers, the wafers being processed must be heated while they are within the reactor tube 11. This heating is done indirectly in the embodiment shown in the drawing by a radio frequency induction coil 23 that is wrapped around the reactor tube 11 without touching it. One end of the induction coil 23 electrically terminates in a pipe 25 and the other end of the coil 23 electrically terminates in a pipe 27. An appropriate radio frequency generator 29 is connected across the pipes 25 and 27 to impress an electrical signal in the radio frequency range across the coil 23.

The susceptor 15 is preferably made of graphite or some other highly electrically conductive material. The radio frequency fields within the reactor tube 11 generated from the coil 23 cause eddy currents to flow in the susceptor 15 and it becomes very hot. This heat is transferred to the wafers resting thereon. For such action, of course, the susceptor 15 must be placed far within the reactor tube 11 to be within the coil 23.

In order to obtain a proper radio frequency distribution, the coil 23 is itself made up of three hollow elongated tubular members 31, 33 and 35. These members are held together in a surface parallel to the surface of the reactor tube 11 to form a single electrical radio frequency inductor.

One end of each of the outside tubular members 31 and 35 is connected with the pipe 25 so that liquid may be transferred from the inside of the tubular members 31 and 35 to the pipe 25. Similarly, the opposite end of each of the tubular members 31 and 35 is connected (not shown) with its internal hollow portion in liquid communication with the interior of the pipe 27. A liquid pump and heat exchanger 37 is connected with the pipes 25 and 27 to circulate liquid through the hollow portion of the tubular members 31 and 35 for cooling. The liquid circulated therethrough is preferably de-ionized water which does not electrically short out the coil 23. A heat exchanger within the block 37 maintains this circulating de-ionized water at a low temperature. This helps somewhat in cooling the reactor tube 11 but it has been found that the stagnant air layer adhering to the outside of the reactor tube 11 insulates the reactor tube and prevents heat transfer from its walls outward.

In order to break down that stagnant air layer, the middle tubular member 33 of the coil 23 carries air or some other inert gas such as nitrogen. A gas pump 39 provides a high pressure flow of gas into the tubular element 33 through four fittings 41, 43, 45 and 47 at different positions along the length of the tubular member 33. The inside surface of the tubular element 33 that faces the outside surface of the reactor tube 11 is then provided with a large number of spaced holes forming gas jets directed against the surface of the reactor tube 11. Holes 49 and 51 shown in the drawing are examples of this. These holes serve as nozzles to direct high velocity gas streams substantially perpendicular against the reactor tube 11 to break-up the insulating stagnant air layer. The holes are spaced apart at about one inch intervals in two directions over both the top and bottom surfaces of the reactor tube 11.

In a specific example, the coil 23 itself is positioned about one-half inch to three-quarters inch away from the outside surface of the reactor tube 11. The holes in the tubular member 33 are 1/32 or 1/64 inch in diameter.

It has been found that the insulating stagnant air layer is satisfactorily broken up if the gas stream exiting from each of the holes of the tubular member 33 travels at at least 5,000 feet per minute. An operating range of from 10,000 to 14,000 feet per minute is actually preferred. The result is a cooler reactor tube 11 during vapor deposition on silicon wafers. Material builds up on the inside surface of the reactor tube 11 at a much slower rate then it does without these air jets because the reactor tube is now permitted to cool without being insulated. The result is that the time consuming job of removing the reactor tube 11 for cleaning of the inside surface is required less often.

This cooling technique is especially valuable when silane (SiH$_4$) is utilized within the reactor tube 11 for a deposition on semi-conductor wafers. Silane is characterized by a low reactive temperature combined with high heat conduction. Thus, when silane gas is used in the reactor tube 11, heat is readily transferred through the gas from the hot susceptor to the walls of the reactor tube 11. At the same time, the low reactive temperature characteristic of silane results in it readily depositing on the inside surface of the reactor tube. By permitting the reactor tube walls 11 to operate cooler, the present invention makes working with silane gas much easier.

This cooling technique is also especially valuable in thick layer depositions on semi-conductor wafers with silane and other materials where the desired deposition time is greater than the time it takes to obtain an undesirable build up of material on the inside surface of the reactor tube. Of course, a given reaction cannot be interrupted to clean the reactor tube so the cooling technique of the present invention permits thicker films to be formed on semi-conductor wafers in a single deposition process.

The main function of the high velocity jets of gas is to break up the stagnant boundary layer on the outside of the reactor tube 11. But it is also desirable to maintain that gas at a reasonably low temperature, certainly less than 100° F., so that it also serves the function of removing some heat from the walls of the reactor tube 11.

The various aspects of the present invention have been described with respect to a preferred embodiment thereof but it will be understood that the invention is entitled to protection within the full scope of the appended claims.

I claim:

1. A reactor for manufacturing semi-conductor wafers by chemical vapor deposition, comprising:
    a hollow reactor tube forming a reaction chamber therein,
    at least one hollow electrically conductive elongated continuous tube formed in a shape of a coil with a plurality of turns positioned about said tube in a non-contacting relationship therewith, said coil having a plurality of holes through the wall thereof at intervals along its length in positions facing the outside surface of said reactor tube,
    a radio frequency source of electrical energy connected to said hollow tubing, whereby wafers positioned within the reactor tube and said coil become heated,
    means for directing gaseous material inside said reactor tube, thereby permitting reaction of desired gaseous material with a heated semi-conductor wafer, and
    means connected to said hollow tube for providing gas thereinto at a pressure much above atmospheric pressure, whereby streams of gas escape from the plurality of holes of said tubing and are directed against the outside surface of said reactor tube.

2. The reactor according to claim 1 wherein said means providing gas to the interior of said tubing and the size and number of holes in said tubing are matched to provide a gas stream velocity escaping from each hole to be in excess of 5,000 feet per minute at the surface of said reaction chamber.

3. The reactor according to claim 2 wherein said hollow reactor tube is made of quartz having a substantially uniform wall thickness therearound.

4. A reactor for manufacturing semi-conductor wafers by chemical vapor deposition, comprising:
    a hollow reactor tube forming a reactor chamber therein,
    means for heating semi-conductor wafers positioned within said chamber,
    means for passing gaseous material into said reactor tube, whereby deposition of gaseous material may be caused to occur,
    at least one hollow elongated continuous hollow tube formed in a shape of a coil with a plurality of turns positioned around said tube about the length thereof and in a non-contacting relationship therewith, said coil having a plurality of holes through the wall thereof at intervals along its length in positions facing the outside surface of said reactor tube, and means connected to said hollow tube for providing gas thereinto at a pressure much above atmospheric pressure, said means providing gas to the interior of said tubing and the size and number of holes in said tubing being matched to provide a gas stream velocity escaping from each hole in excess of 5,000 feet per minute at the surface of said reaction chamber, whereby streams of gas escaping from the plurality of holes of said tubing are directed against the outside of said reactor tube with sufficient force to break up a stagnant layer of air at said surface and thus permitting said chamber walls to cool.

5. The reactor according to claim 4 wherein, said gas providing means includes means for maintaining the gas escaping from the plurality of holes at less than 100° F.

6. A reactor for manufacturing semi-conductor wafers by chemical vapor deposition, comprising:

a reactor tube forming a reaction chamber therein and having walls therearound with substantially uniform thickness, three hollow electrically conductive elongated continuous tubes held in a side-by-side relation and formed in a shape of a coil with a plurality of turns positioned about said tube in a non-contacting relationship therewith, a middle of said hollow tubes having a plurality of holes through the wall thereof at intervals along its length in positions facing the outside surface of said reactor tube, means connected to said middle hollow tube for providing gas thereinto at a pressure much above atmospheric pressure, whereby streams of gas escape from the plurality of holes of said tubing and are directed against the outside surface of said reactor tube, means for circulating a liquid coolant through the other two of said hollow tubes, a radio frequency source of electrical energy connected to said coil, whereby wafers positioned within the reactor tube and said coil become heated, and means for directing gaseous material inside said reactor tube, thereby permitting reaction of desired gaseous material with a heated semi-conductor wafer.

* * * * *